United States Patent
Demos et al.

(10) Patent No.: US 7,425,716 B2
(45) Date of Patent: Sep. 16, 2008

(54) METHOD AND APPARATUS FOR REDUCING CHARGE DENSITY ON A DIELECTRIC COATED SUBSTRATE AFTER EXPOSURE TO A LARGE AREA ELECTRON BEAM

(75) Inventors: Alexandros T. Demos, Fremont, CA (US); Khaled A. Elsheref, San Jose, CA (US); Yuri Trachuk, San Jose, CA (US); Tom K. Cho, Palo Alto, CA (US); Girish A. Dixit, San Jose, CA (US); Hichem M'Saad, Santa Clara, CA (US); Derek Witty, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 240 days.

(21) Appl. No.: 11/414,649

(22) Filed: Apr. 27, 2006

(65) Prior Publication Data
US 2006/0192150 A1    Aug. 31, 2006

Related U.S. Application Data

(63) Continuation of application No. 11/002,600, filed on Dec. 1, 2004, now abandoned.

(60) Provisional application No. 60/558,009, filed on Mar. 30, 2004.

(51) Int. Cl.
H02H 23/00 (2006.01)
(52) U.S. Cl. .................. 250/492.3; 261/233; 261/234
(58) Field of Classification Search .............. None
See application file for complete search history.

(56) References Cited

U.S. PATENT DOCUMENTS

| | | | |
|---|---|---|---|
| 5,003,178 A | 3/1991 | Livesay | |
| 5,459,632 A | 10/1995 | Birang et al. | |
| 5,468,595 A | 11/1995 | Livesay | |
| 6,132,814 A | 10/2000 | Livesay et al. | |
| 6,150,070 A | 11/2000 | Minter et al. | |
| 6,195,246 B1 | 2/2001 | Livesay et al. | |
| 6,204,201 B1 | 3/2001 | Ross | |
| 6,207,555 B1 | 3/2001 | Ross | |

(Continued)

OTHER PUBLICATIONS

Czernik, "Gaskets: Design, Selection, and Testing," 1st ed., McGraw-Hill, New York, 1996, p. 1.

*Primary Examiner*—David A. Vanore
(74) *Attorney, Agent, or Firm*—Townsend and Townsend and Crew (57) ABSTRACT

Embodiments in accordance with the present invention relate to a number of techniques, which may be applied alone or in combination, to reduce charge damage of substrates exposed to electron beam radiation. In one embodiment, charge damage is reduced by establishing a robust electrical connection between the exposed substrate and ground. In another embodiment, charge damage is reduced by modifying the sequence of steps for activating and deactivating the electron beam source to reduce the accumulation of charge on the substrate. In still another embodiment, a plasma is struck in the chamber containing the e-beam treated substrate, thereby removing accumulated charge from the substrate. In a further embodiment of the present invention, the voltage of the anode of the e-beam source is reduced in magnitude to account for differences in electron conversion efficiency exhibited by different cathode materials.

27 Claims, 9 Drawing Sheets

U.S. PATENT DOCUMENTS

| | | |
|---|---|---|
| 6,218,090 B1 | 4/2001 | Minter et al. |
| 6,255,035 B1 | 7/2001 | Minter et al. |
| 6,271,146 B1 | 8/2001 | Ross |
| 6,319,555 B1 | 11/2001 | Anderson |
| 6,319,655 B1 | 11/2001 | Wong et al. |
| 6,340,556 B1 | 1/2002 | Wong |
| 6,358,670 B1 | 3/2002 | Wong et al. |
| 6,407,399 B1 | 6/2002 | Livesay |
| 6,426,127 B1 | 7/2002 | Ross et al. |
| 6,541,367 B1 | 4/2003 | Mandal |
| 6,596,627 B2 | 7/2003 | Mandal |
| 6,607,991 B1 * | 8/2003 | Livesay et al. ............... 438/787 |
| 6,646,857 B2 * | 11/2003 | Anderson et al. ........... 361/234 |
| 6,790,375 B1 * | 9/2004 | Howald et al. ................. 216/67 |
| 6,831,284 B2 * | 12/2004 | Demos et al. ............ 250/492.3 |
| 6,898,064 B1 * | 5/2005 | Berman et al. ............... 361/234 |
| 6,965,506 B2 * | 11/2005 | Howald ...................... 361/234 |
| 2004/0101632 A1 | 5/2004 | Zhu et al. |

* cited by examiner

SCREW DOWN IN VAC AND
STRAP T/C SHEATH TO M/F

FIG. 7D

METAL GASKET IN ATM

METHOD AND APPARATUS FOR REDUCING CHARGE DENSITY ON A DIELECTRIC COATED SUBSTRATE AFTER EXPOSURE TO A LARGE AREA ELECTRON BEAM

CROSS-REFERENCES TO RELATED APPLICATIONS

This application is a continuation of U.S. patent application Ser. No. 11/002,600, filed on Dec. 1, 2004, which claims the benefit of U.S. Provisional Application No. 60/558,009, filed on Mar. 30, 2004. The disclosures of Ser. Nos. 11/002, 600 and 60/558,009 are herein incorporated by reference in their entirety for all purposes.

BACKGROUND OF THE INVENTION

Semiconductor device geometries have dramatically decreased in size since integrated circuits were first introduced several decades ago, and all indications are that this trend will continue on. Today's wafer fabrication plants are routinely producing devices having 0.25 µm and even 0.18 µm feature sizes, and the plants of the future will soon be producing devices having even smaller geometries.

As device sizes become smaller and integration density increases, one issue that has become an increasing concern to semiconductor manufacturers is that of inter-level "crosstalk." Crosstalk is the undesired coupling of an electrical signal on one metal layer onto another metal layer, and arises when two or more layers of metal with intervening insulating or dielectric layers are formed on a substrate. Crosstalk can be reduced by moving the metal layers further apart, minimizing the areas of overlapping metal between metal layers, reducing the dielectric constant of the material between metal layers and combinations of these and other methods. Undesired coupling of electrical signals can also occur between adjacent conductive traces, or lines, within a conductive layer. As device geometries shrink, the conductive lines become closer together and it becomes more important to isolate them from each other.

Another issue that is becoming more of a concern with decreasing feature sizes is the "RC time constant" of a particular trace. Each trace has a resistance, R, that is a product of its cross section and bulk resistivity, among other factors, and a capacitance, C, that is a product of the surface area of the trace and the dielectric constant of the material or the space surrounding the trace, among other factors. If a voltage is applied to one end of the conductive trace, charge does not immediately build up on the trace because of the RC time constant. Similarly, if a voltage is removed from a trace, the trace does not immediately drain to zero. Thus high RC time constants can slow down the operation of a circuit. Unfortunately, shrinking circuit geometries produce narrower traces, which results in higher resistivity. Therefore it is important to reduce the capacitance of the trace, such as by reducing the dielectric constant of the surrounding material between traces, to maintain or reduce the RC time constant.

Hence, in order to further reduce the size of devices on integrated circuits, it has become necessary to use insulators having a low dielectric constant. And as mentioned above, low dielectric constant films are particularly desirable for premetal dielectric (PMD) layers and intermetal dielectric (IMD) layers to reduce the RC time delay of the interconnect metallization, to prevent crosstalk between the different levels of metallization, and to reduce device power consumption.

The traditional insulator used in the fabrication of semiconductor devices has been undoped silicon oxide. Undoped silicon oxide films deposited using conventional CVD techniques may have a dielectric constant (k) as low as approximately 4.0 or 4.2. Many approaches have been proposed for obtaining insulating layers having a lower dielectric constant. Amongst these have been fluorine-doped silicon oxide films that may have a dielectric constant as low as 3.4 or 3.6. Another approach has been the development of carbon-doped silicon oxide (CDO) films. In some cases, CDO films are treated with e-beam radiation during and/or after growth in order to improve the film properties.

The use of electron beam (e-beam) radiation to treat materials is well known. For example, e-beams have been used for curing interlayer dielectrics for microelectronic devices, photoresist exposure, altering solubility characteristics of thin film layers, and the like. Often, the electron sources utilized in the past to generate e-beams for such electron beam treatments have been electron guns, which produce e-beams of narrow cross-section. For some applications, it is desirable to provide a large-area e-beam source which is controllable, uniform, insensitive to poor vacuum, and long lived. Thus, large area e-beam sources have been developed, some of which are suitable for use in semiconductor processing applications. An example of such a large-area e-beam source is described in U.S. Pat. No. 5,003,178, incorporated herein by reference in its entirety for all purposes.

When such a large area e-beam is used during a semiconductor fabrication process, charge buildup can occur in the materials present on the semiconductor substrate. For example, charge may buildup in dielectric layers deposited on the semiconductor substrate. Excessive charge buildup may result in unwanted electrical effects, including electrical breakdown across fragile structures such as MOS gate oxides, resulting in possible damage to the semiconductor devices.

Therefore, there is a need in the art for methods and structures which reduce the buildup of charge during electron beam treatment of semiconductor substrates.

SUMMARY OF THE INVENTION

Embodiments in accordance with the present invention relate to a number of techniques, which may be applied alone or in combination, to reduce charge damage of substrates exposed to electron beam radiation. In accordance with one embodiment, charge damage may be reduced by establishing a robust electrical connection between the exposed substrate and ground. In accordance with another embodiment, charge damage may be reduced by modifying the sequence of steps for activating and deactivating the electron beam source, thereby reducing charge accumulation on the substrate. In accordance with still another embodiment, a plasma may intentionally be struck in the chamber following e-beam exposure, thereby removing accumulated charge from the substrate. In accordance with still a further embodiment of the present invention, voltage on the anode of the e-beam source may be reduced in magnitude to account for differences in the electron conversion efficiency of different anode materials.

An embodiment of a method in accordance with the present invention of irradiating a substrate with an electron beam, comprises, disposing a substrate within a chamber proximate to an anode of an electron beam source, and placing the substrate into electrical contact with ground through a supporting pin. The substrate is then exposed to radiation from the electron beam.

An alternative embodiment of a method in accordance with the present invention of irradiating a substrate with an electron beam, comprises, disposing a substrate within a chamber proximate to an anode of an electron beam source, and flowing a processing gas into the chamber for a predetermined time. A bias voltage is applied to the source anode after the predetermined time. The substrate is exposed to an electron beam emitted from a cathode of the electron beam source, by applying a high voltage to the source cathode, and delaying regulation of a chamber throttle valve to adjust a current of the electron beam until after the high voltage has been applied to a source cathode for a second predetermined time.

An embodiment of a method in accordance with the present invention of treating a substrate with an electron beam, comprises, disposing a substrate within a chamber proximate to an anode of an electron beam source, and applying a bias voltage to the source anode. The substrate is exposed to an electron beam emitted from a cathode of the electron beam source, and a plasma is introduced into the chamber following exposure of the substrate to the electron beam.

Another alternative embodiment of a method of irradiating a substrate with an electron beam, comprises, disposing a substrate within a chamber proximate to an aluminum anode of an electron beam source, and applying a bias voltage to the source anode. A high voltage is applied to an aluminum cathode of the electron beam source, such that a voltage difference between the source anode and the source cathode is between about 1-30 keV.

Another alternative embodiment of an apparatus for treating a substrate with electron beam radiation, comprises, a processing chamber enclosing a substrate support, and an electron beam source comprising an anode proximate to the substrate support and a cathode distal from the substrate support. A ground pin is configured to be in electrical communication with an underside of a supported substrate, and in electrical communication with ground.

These and other objects and features of the present invention and the manner of obtaining them will become apparent to those skilled in the art, and the invention itself will be best understood by reference to the following detailed description read in conjunction with the accompanying drawings.

DETAILED DESCRIPTION OF THE INVENTION

Embodiments of the present invention relate generally to semiconductor processing. Particular embodiments provide a method and structure to control charge buildup in dielectric films. Merely by way of example, the invention has been applied to reducing charge buildup in dielectric films after exposure to radiation from a large area electron beam. The method and structure can be applied to other applications including, but not limited to, the control of charge buildup in other materials, such as semiconductor materials, composite semiconductor/dielectric materials, and the like.

U.S. Pat. No. 5,003,178, incorporated herein by reference for all purposes, describes a design for a large-area uniform electron source. The following additional U.S. patents, describing various applications for electron beam processing, are also incorporated hereby by reference: U.S. Pat. Nos. 5,468,595, 6,132,814, 6,204,201, 6,207,555, 6,271,146, 6,319,655, 6,407,399, 6,150,070, 6,218,090, 6,195,246, 6,218,090, 6,426,127, 6,340,556, 6,319,555, 6,358,670, and U.S. Pat. No. 6,255,035.

Figure 1:
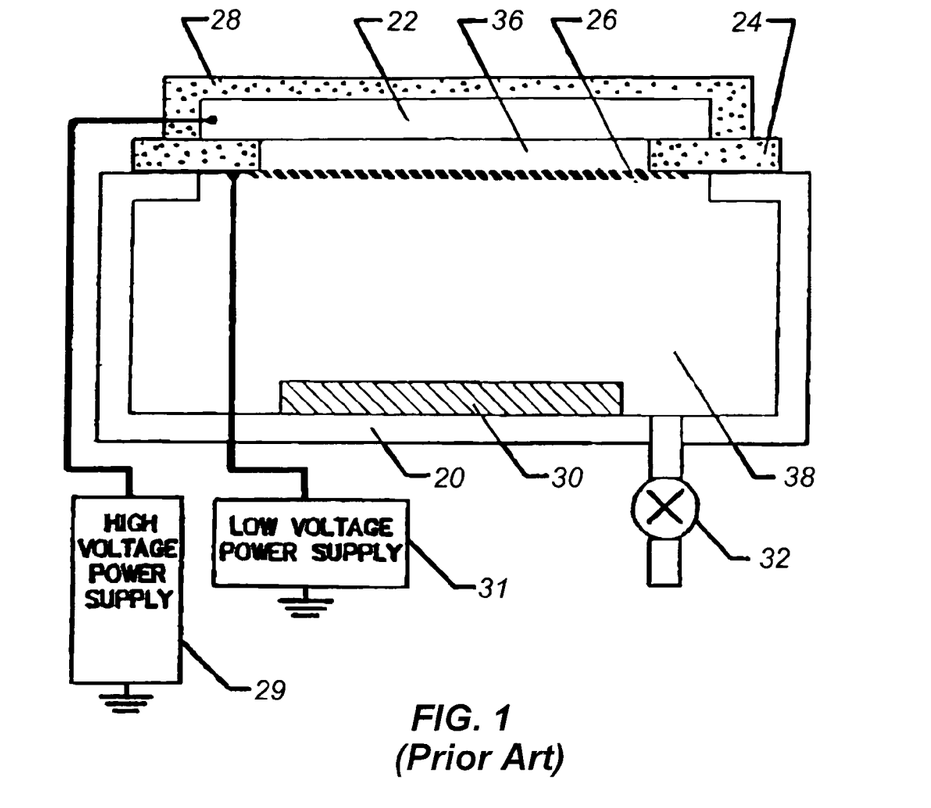
FIG. 1 is a simplified elevational view showing an electron beam exposure apparatus including the presently preferred embodiment of the new electron source.

FIG. 1 shows a cross-sectional view of one embodiment of an apparatus for applying electron beam radiation in accordance with the present invention. Cold cathode gas discharge electron source includes a vacuum chamber, indicated by reference numeral 20, a large-area cathode 22, a target or substrate 30, located in a field-free region 38, and a grid (fine mesh screen) anode 26 placed between the target 30 and cathode 22, at a distance from the cathode that is less than the mean free path length of electrons emitted from the cathode. The current can be varied over a wide range by varying the bias voltage applied to grid 26.

The apparatus of the invention further includes a high voltage insulator 24, which isolates the grid 26 from the large-area cathode 22, a cathode cover insulator 28 located outside the vacuum, a variable leak valve 32 for controlling the pressure inside the vacuum chamber 20, a variable high voltage power supply 29 connected to the cathode 22, and a variable low voltage 0 to −500 volt power supply 31 connected to the grid 26. In some embodiments, the variable leak valve 32 is referred to as a throttle valve 32.

In operation of the apparatus of the invention, the substrate to be exposed with the electron beam is placed on the target plane 30, and the vacuum chamber 20 is pumped from atmospheric pressure to a pressure in the range of 1 to 200 milliTorr. The exact pressure is controlled via the variable rate leak valve 32, which is capable of controlling pressure to +/−1 milliTorr. The high voltage (negative voltage between −500 volts and −30,000 volts or more) at which the exposure is to take place is applied to the cathode 22 via the high voltage power supply 29. A variable voltage source 31 (for example: a DC power supply capable of sourcing or sinking current) is also applied to the grid anode 26. The voltage on the grid is utilized to control electron emission from the cathode, as will now be described with reference to FIG. 2.

Figure 2:
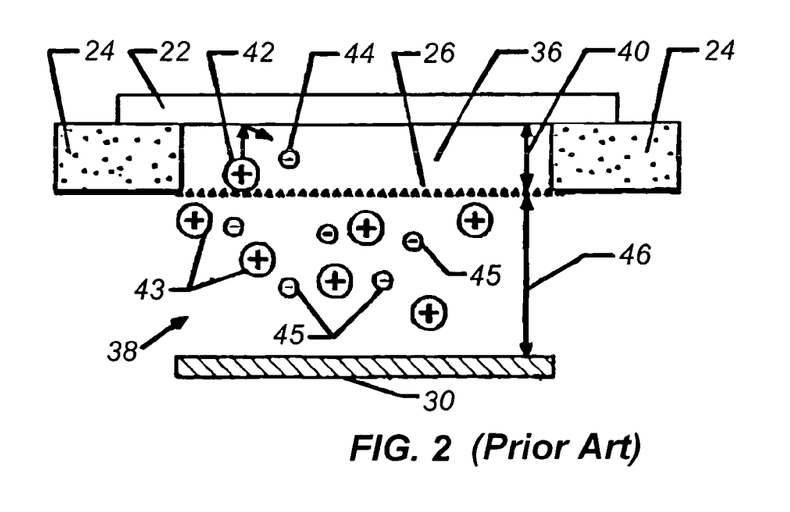
FIG. 2 is a fragmentary view similar to FIG. 1, but also showing schematically some of the details of operation.

To initiate electron emission, the gas in the space between the cathode 22 and the target 30 must become ionized, producing positive ions 43 and electrons 45. This transpires as a result of naturally occurring gamma rays, or emission can instead be initiated artificially inside the chamber by a high voltage spark gap. Once this initial ionization takes place, positive ions 43 are attracted to the grid 26 by a slightly negative voltage (0 to −80 volts) applied to the grid 26. These positive ions 42 pass into the accelerating field region 36 between the cathode 22 and the grid anode 26 and are accelerated towards the cathode surface 22 as a result of the high voltage applied to the cathode (−500 to −30,000 volts). Upon striking the cathode surface these high energy ions produce secondary electrons 44 which are accelerated back toward the grid 26. Some of these electrons, which are now traveling mostly perpendicular to the cathode surface, strike the grid (anode) structure 26 but many pass through the grid and continue on to the target 30. These high energy electrons ionize the gas molecules in the space between the grid 26 and the target 30.

The fine mesh grid 26 is placed at a distance less than the mean free path of the electrons emitted by the cathode. Therefore no significant ionization takes place in the accelerating field region 36 between the grid and the cathode. (In a conventional gas discharge device the electrons emitted would create further positive ions in the accelerating field region and all of these ions would be accelerated back to the cathode creating even more electron emission and the discharge could easily avalanche into an unstable high voltage breakdown.) However, in this invention, the ions 42 created outside the grid are controlled (repelled or attracted) by the voltage applied to the grid 26. Thus, the emission (electron beam current) can be continuously controlled (from very small currents to very large currents) by varying the voltage on the grid. Alternatively, the electron emission can be controlled by means of the variable leak valve 32, which can raise or lower the number of molecules in the ionization region between the target and cathode. However, due to the slow response time of adjusting the pressure in the chamber, it is more advantageous to adjust the pressure initially to produce some nominal emission current and then utilize the bias voltage on the grid 26 to rapidly and precisely control emission current.

The electron emission can be turned off entirely by applying a positive voltage to the grid 26, such that the positive grid voltage exceeds the energy of any of the positive ion species created in the space between the grid 26 and target 30. It has been found that the grid can be located a distance less than 4 mm from the cathode. This distance is less than the mean free path of electrons for the lowest voltage of interest (500 volts) and preferred operating vacuum pressure level. In the prior art practiced by Induni, he strived for a high vacuum in the accelerating field region to prevent breakdown.

Fortuitously, the preferred operating vacuum level of this invention is in the region of highest electrical dielectric strength. Therefore, even though the grid-to-cathode gap must by necessity be very small to be less than the mean free path determined by the lowest desired operating accelerating voltage, the system is operated at a vacuum level where the breakdown strength of the vacuum exceeds the field created by the highest operating voltage applied across the selected grid-to-cathode spacing. This low or soft vacuum level (20 to 80 millitorr) is easily achieved by inexpensive mechanical vacuum pumps and allows the cathode 22 and target 30 to be placed in close proximity to each other in the same vacuum environment.

Further, this mechanism of ion bombardment induced electron emission maintains a clean and uniform emitting cathode surface. Although this continual ion bombardment causes erosion of the cathode surface due to sputtering, by utilizing a low sputtering yield cathode material, such as aluminum, the cathode can be operated continuously for many thousands of hours without requiring replacement.

Figure 3:
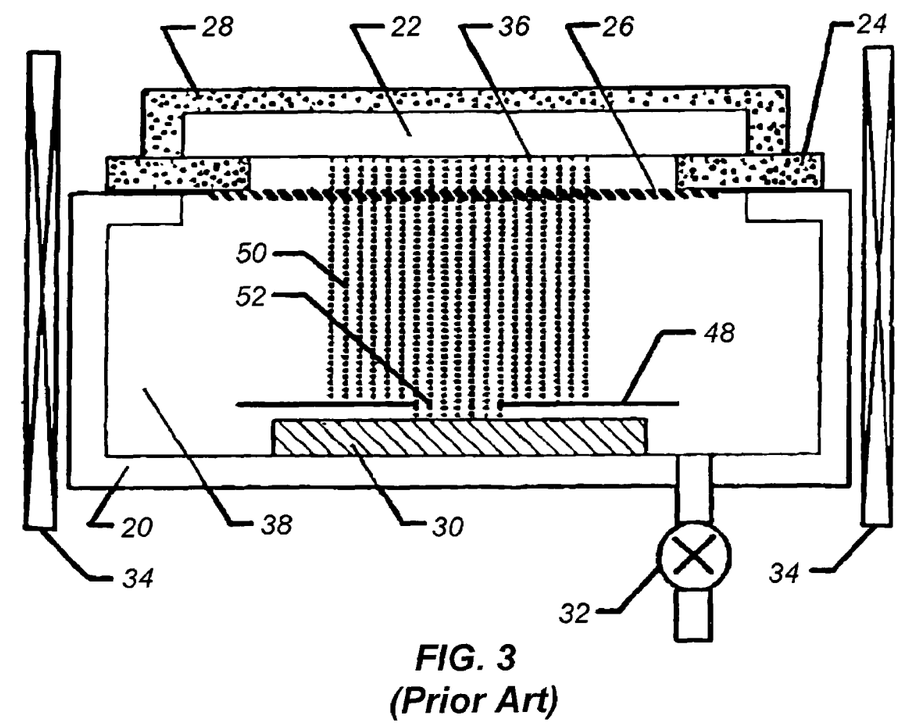
FIG. 3 is a view similar to FIG. 1, but also showing use of the invention in shadow mask lithography.

The electrons emitted from the cathode 22 are accelerated to the grid 26 and are mostly traveling perpendicular to the grid and cathode surface. Some emitted electrons are intercepted by the grid and some are scattered by the grid. If the target 30 is within a few millimeters of the grid, the electrons will cast an image of the grid on the target. However, if the target is placed at a large distance 46, such as 10 to 20 centimeters from the grid, the electron beam diffuses (due to initial transverse velocities and scattering) to a fairly uniform current density across the whole emitting area. The irradiation of the target can be made even more uniform by sweeping the beam back and forth across the target by means of a time-varying magnetic field produced by deflection coils 34 surrounding the exposure chamber, as shown in FIG. 3.

Reduction in Charge Damage

As described in detail below, the application of electron beam radiation to process substrates may prove useful for a number of applications. In many of those applications, the electron beam radiation is applied to induce a chemical or physical transformation of material on the substrate. One unintended consequence of such irradiation, however, may be the accumulation of charge on the wafer and resulting damage to electrically active structures present thereon.

Moreover, as the thickness of the dielectric films used as gate oxides in MOSFET devices has decreased, issues related to gate charge damage have become more prominent. For example, during the e-beam treatment of carbon-doped oxide (CDO) films used as gate oxides, excessive charge buildup in the dielectric film can lead to gate charge damage. This gate charge damage can take the form of oxide breakdown, resulting in device degradation. Higher leakage currents, as well as a shift in the threshold voltage, have been observed as a result of gate charge damage.

Figure 12:
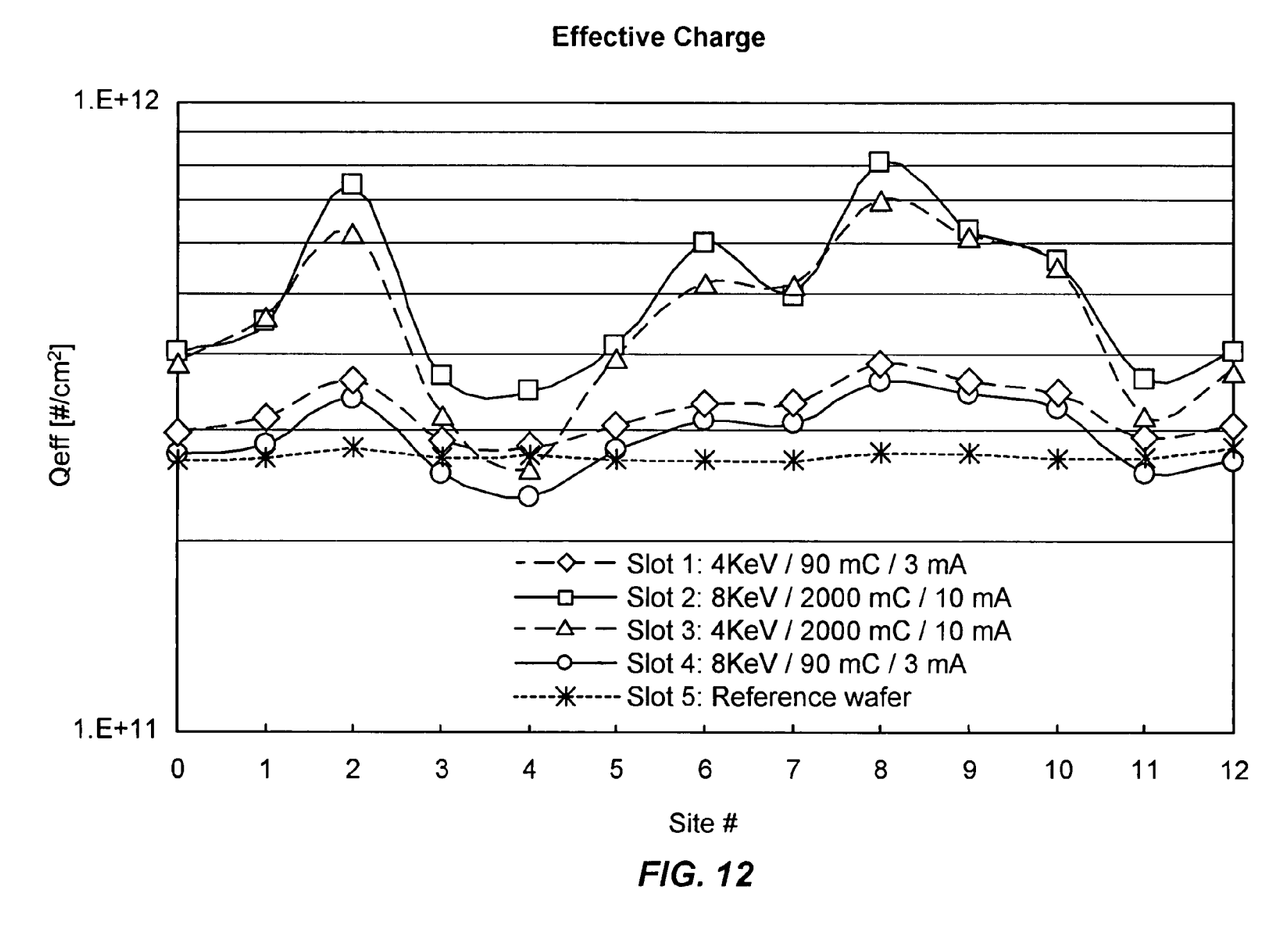
FIG. 12 plots accumulated charge for substrates exposed to electron beam radiation under different conditions.

FIG. 12 plots effective charge for a number of sites on a substrate treated with electron beam radiation. The substrate used in this study is a Si wafer bearing a high quality thermal oxide 1000 Å thick, which accumulated charge after treatment with e-beam radiation under the various conditions listed. The total effective charge was measured utilizing the Quantox XP tool manufactured by KLA Tencor of San Jose, Calif.

As shown in FIG. 12, the effective charge on the wafer increases with the dose of the applied e-beam radiation. Specifically, the effective charge for a wafer receiving a dose of 2000 $\mu C/cm^2$ is considerably larger than that for the wafer receiving an e-beam dose of 100 $\mu C/cm^2$. For purposes of comparison, FIG. 12 also plots effective charge for a reference wafer not receiving any electron beam radiation.

Embodiments in accordance with the present invention relate to a number of techniques, which may be applied alone or in combination, to reduce charge damage of substrates exposed to electron beam radiation. In one embodiment, charge damage is reduced by establishing a robust electrical connection between the exposed substrate and ground. In another embodiment, charge damage is reduced by modifying the sequence of steps for activating and deactivating the electron beam source to reduce the accumulation of charge on the substrate. In still another embodiment, a plasma is struck in the chamber containing the e-beam treated substrate, thereby removing charge accumulated by the substrate. In a further embodiment of the present invention, voltage of the anode of the e-beam source is reduced in magnitude to account for differences in electron conversion efficiency exhibited by different anode materials.

A. Substrate Grounding

Figure 7A:
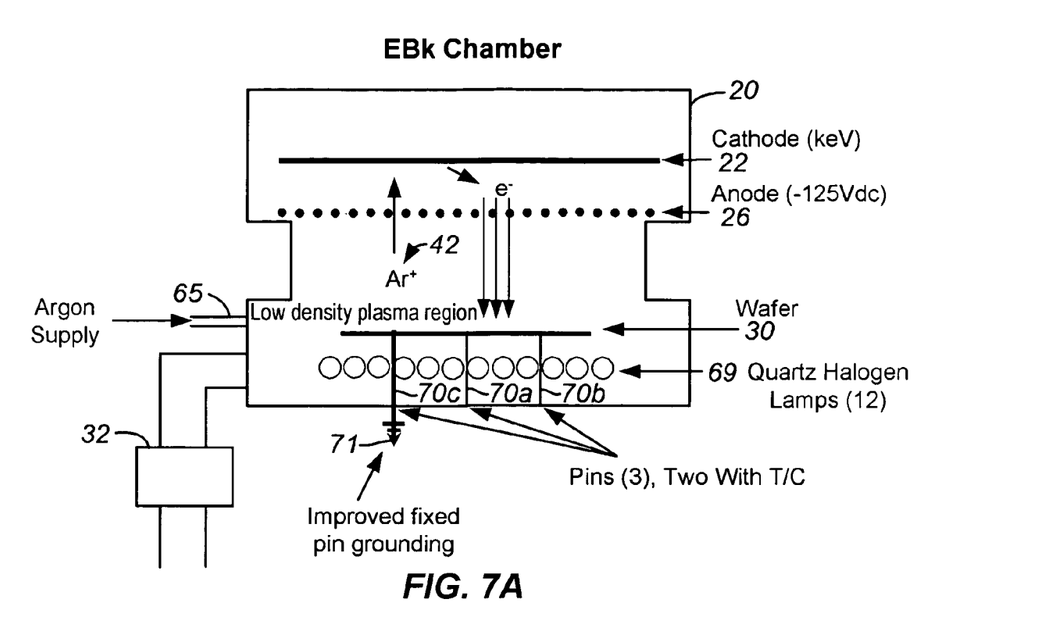
FIG. 7A shows a simplified cross-sectional view of an electron beam exposure chamber in accordance with an embodiment of the present invention.

Referring to FIG. 7A, substrate 30 is in electrical contact with a plurality of pins 70 during processing operations. The substrate is heated, in one embodiment, by quartz halogen lamps 69 and process gases are supplied through gas inlet 65. The substrate 30 is transferred into and out of the body of the chamber by a robot blade (not shown) through an insertion/removal opening (not shown) in the side of the chamber. The motor raises and lowers the substrate between a processing position and a substrate-loading position (not shown). In the embodiment according to the present invention illustrated in FIG. 7A, when the substrate is in a processing position, at least one of the fixed pins 70 is in electrical contact with the lower surface of the semiconductor substrate. The fixed pin in electrical contact with the substrate is referred to as a ground pin in a specific embodiment.

The ions 42 created outside the grid 26 are controlled (repelled or attracted) by the voltage applied to the grid 26. Thus, the emission (electron beam current) can be continuously controlled from very small currents to very large currents (i.e. from about 1 mA to about 15 mA) by varying the voltage on the grid 26. Alternatively, the electron emission can be controlled by means of the throttle valve 32 (referring to FIG. 1), which can raise or lower the number of molecules in the ionization region between the cathode and the substrate. The electron emission can be turned off entirely by applying a positive voltage to the grid 26, such that the positive grid voltage exceeds the energy of any of the positive ion species created in the space between the grid 26 and the substrate 30.

Conventionally, the ground pin may be in only slidable contact, rather than mechanical contact, with the surrounding chamber structure. Such a slip fit of the pin within the chamber may not ensure reliable contact with ground under vacuum processing conditions, causing the processed substrate to electrically float, and allowing it to accumulate charge.

Figure 7B:
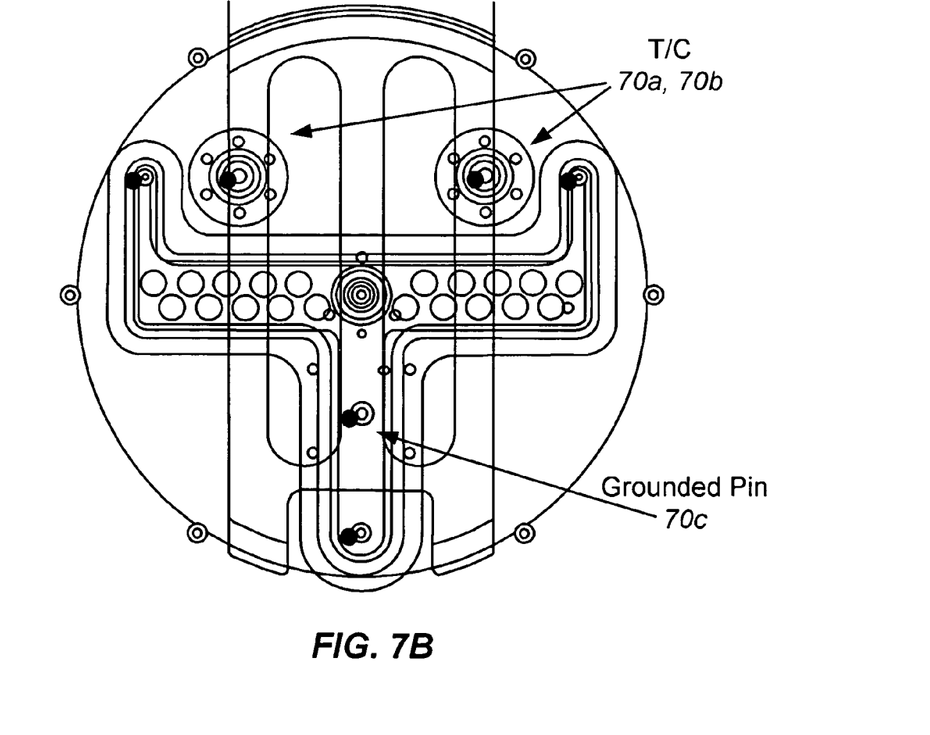
FIG. 7B illustrates a plan view of a support for a substrate within an electron beam exposure chamber.

In accordance with one embodiment of the present invention, however, at least one fixed ground pin 70c may be placed into reliable electrical connection with a ground line that communicates with the exterior of the chamber. In one particular embodiment shown in cross-section in FIG. 7A and in plan view in FIG. 7B, when the wafer is in the processing position, two of the three pins, 70a-b, act as a thermocouple (T/C). The third, ground pin 70c, is in electrical contact with the lower surface of the semiconductor substrate 30, and is also electrically connected with ground line 71 at a point inside the chamber, which, in turn, is routed to exit the chamber and makes electrical connection with the system ground. Thus, charge that would otherwise build up in the dielectric layers deposited on the wafer surface, is able to dissipate by flowing through the ground pin to the system ground.

Figure 7C:
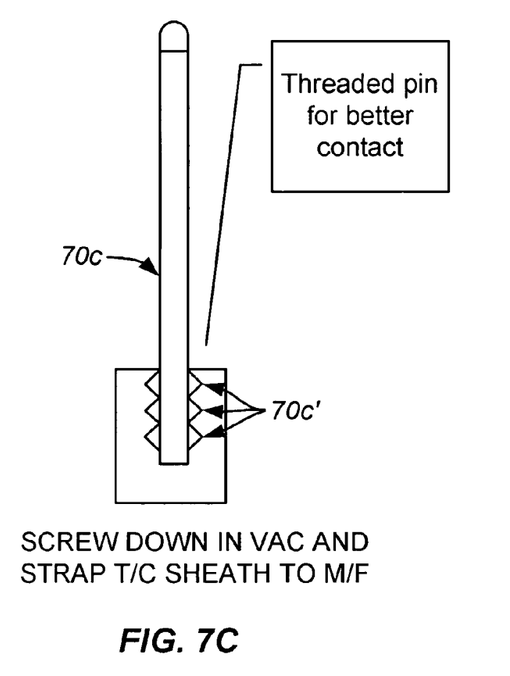
FIG. 7C shows a simplified cross-sectional view of an embodiment of a grounded support pin in accordance with the present invention.

FIG. 7C shows a simplified cross-sectional view of an embodiment of an improved ground pin design in accordance with the present invention. In the embodiment of FIG. 7C, the bottom portion of the shaft of ground pin 70c bears threads 70c' for engagement with the surrounding conductive material, thereby ensuring more robust electrical connection between the pin and ground. The embodiment of FIG. 7C is particularly suited for retrofitting of existing chamber designs, wherein a threaded bore can be drilled to receive the ground pin.

Figure 7D:
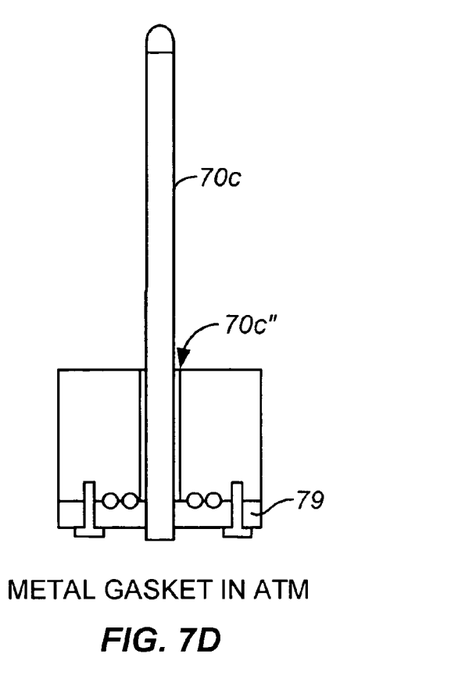
FIG. 7D shows a simplified cross-sectional view of an alternative embodiment of a grounded support pin in accordance with the present invention.

FIG. 7D shows a simplified cross-sectional view of an alternative embodiment of an improved ground pin design in accordance with the present invention. Ground pin 70c is positioned within bore 70c", that has been expanded through the chamber body to contact the atmosphere. Metal gasket 79 allows for robust electrical contact between the pin and the grounded body of the chamber.

In accordance with still another alternative embodiment of the present invention, the thermocouple (T/C) pins could be utilized to promote grounding by installing a strap to contact the thermocouple sheath with the grounded mainframe (M/F) of the tool. In accordance with still other alternative embodiments of the present invention, a plurality of fixed ground pins may be electrically connected to a ground line that communicates with the exterior of the chamber. In these alternative embodiments, the ground line is electrically connected to the system ground at a location external to the chamber.

B. E-beam Activation/Deactivation

During processing, a substrate is inserted into the chamber, and then the various components of the tool are activated to commence irradiation, and then deactivated to halt irradiation. For activation, conventionally the lamps are turned on first, and then the Ar gas flow and bias voltage are initiated simultaneously. Next, the high power voltage supply is turned on, and the beam current established by varying the position of the throttle valve.

In accordance with embodiments of the present invention, however, it has been discovered that establishing a flow of the gas simultaneously with application of a bias voltage may prove conducive to the formation of plasma spikes leading to accumulation of charge on the wafer. Accordingly, embodiments in accordance with the present invention propose an alternative series of steps to initiate e-beam irradiation.

Figure 8:
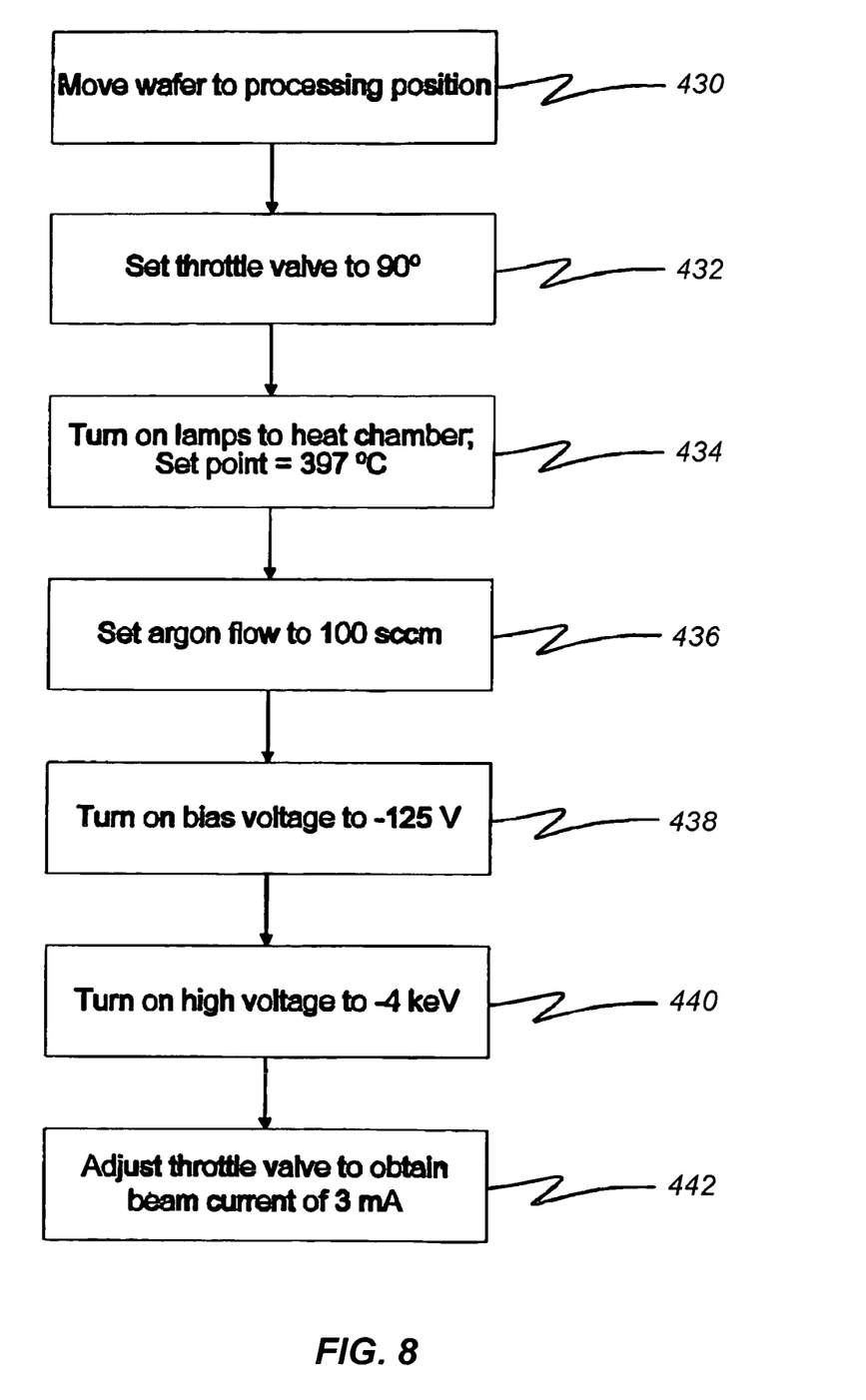
FIG. 8 is a simplified flowchart of a turn-on sequence used in an alternative embodiment according to the present invention.

In one specific embodiment, application of the bias voltage is delayed until after the Ar gas is flowed for a brief period. This sequence creates a stable gas environment for initiation of the plasma. Regulation of the throttle valve to adjust beam current is then delayed until after the high voltage has been applied. This combination of steps serves to suppress plasma spikes FIG. 8 is a simplified flowchart of a turn-on sequence used in one alternative embodiment according to the present invention. As illustrated in step 430 of FIG. 8, the transfer robot and wafer lift mechanism are actuated to move the wafer into the processing position. The throttle valve is set at 90° (the full open position) in step 432 to exhaust the maximum volume of gases from the chamber. As will be evident to those skilled in the art, the order of steps 430 and 432 is interchangeable as no gas is flowing into the chamber at step 430 as illustrated in FIG. 8.

In step 434, heating elements are turned on to increase the chamber temperature in anticipation of processing operations. In the embodiment illustrated in FIG. 8, quartz halogen heat lamps are used, the set point is set to a temperature of 397° C., and the final chamber temperature reaches 400° C. In a particular embodiment, the time required to heat the chamber to 400° C. is less than 130 seconds. Alternative embodiments according to the present invention utilize increased or decreased processing temperatures, with varying times required to reach the desired temperature.

After a slight delay, in step 436 a process gas is introduced into the chamber at a predetermined flow rate. In the embodiment illustrated in FIG. 8, the process gas is argon and the flow rate is 100 sccm. In a particular embodiment, the delay is 5 seconds and the time allotted to step 436 is 10 seconds. In an embodiment in which the throttle valve is set at 90° and maintained at that position through step 436, the chamber pressure during step 436 is in the range of 12-15 mTorr.

After a delay of time to allow stabilization of voltages and thereby suppress unwanted spiking, in step 438 the bias voltage on the anode is then set. As discussed in detail below, in certain embodiments the bias voltage may be set to −125 V, and in other embodiments the bias voltage may be set at a lower value such as −50 V. In a particular embodiment, the delay is 10 sec. and the time allotted to step 438 is 5 seconds.

In step 440, the cathode voltage (high voltage) is set to −4 KeV and the e-beam is initiated as discussed in reference to FIG. 1.

After a delay to suppress plasma spikes, the throttle valve is partially closed in step 442 to increase the pressure in the chamber and adjust the e-beam current to a predetermined amount. In a specific embodiment, the throttle valve position is controlled by a system controller to produce an e-beam current (measured at the cathode) that is equal to 3 mA at a high voltage setting of −4 keV and a throttle valve position of about 30°. In this embodiment, the chamber pressure, given these settings, is in the range of about 20-30 mTorr. In alternative embodiments, the e-beam current that is produced is equal to 6.0 mA, with a high voltage setting of −6 keV and a throttle valve position in the range of about 35-40°.

As will be evident to one of skill in the art, the high voltage setting, the throttle valve position, and the e-beam current are related. None of these specific e-beam currents are required by the present invention. One of skill in the art will modify these settings to achieve the desired e-beam processing parameters.

During e-beam treatment of the semiconductor substrate, the exposure dose (e-beam current density multiplied by exposure time) is measured. In a particular embodiment, the exposure dose endpoint is 150 $\mu C/cm^2$. In an alternative embodiment, the exposure dose endpoint is 1,000 $\mu C/cm^2$. Other embodiments utilize different exposure dose endpoints as necessary for their particular processing protocol. In embodiments according to the present invention, the e-beam processing is continued until a predetermined exposure dose is reached, whereupon the e-beam processing is terminated.

Conventionally, the electron beam irradiation is halted by turning off the lamps, the Argon gas flow, the bias and high voltages, and the beam current, simultaneously. In accordance with embodiments of the present invention, however, it has been discovered that a different sequence of steps to halt irradiation may reduce accumulation of charge on the substrate.

In accordance with one embodiment of the present invention, the beam current may be turned off first, in order to stop the flow of electrons to the wafer. Next, with the bias voltage remaining on, the high voltage is turned off, thereby allowing a low density plasma to be sustained and dissipate accumulated charge from the wafer. For purposes of this patent application, the term "low density plasma" refers to a plasma exhibiting a density of $1 \times 10^8$ ions/$cm^3$ or less. Once the low density plasma has allowed dissipation of charge, the bias voltage is then turned off, followed by the lamps and the Ar flow.

Figure 9:
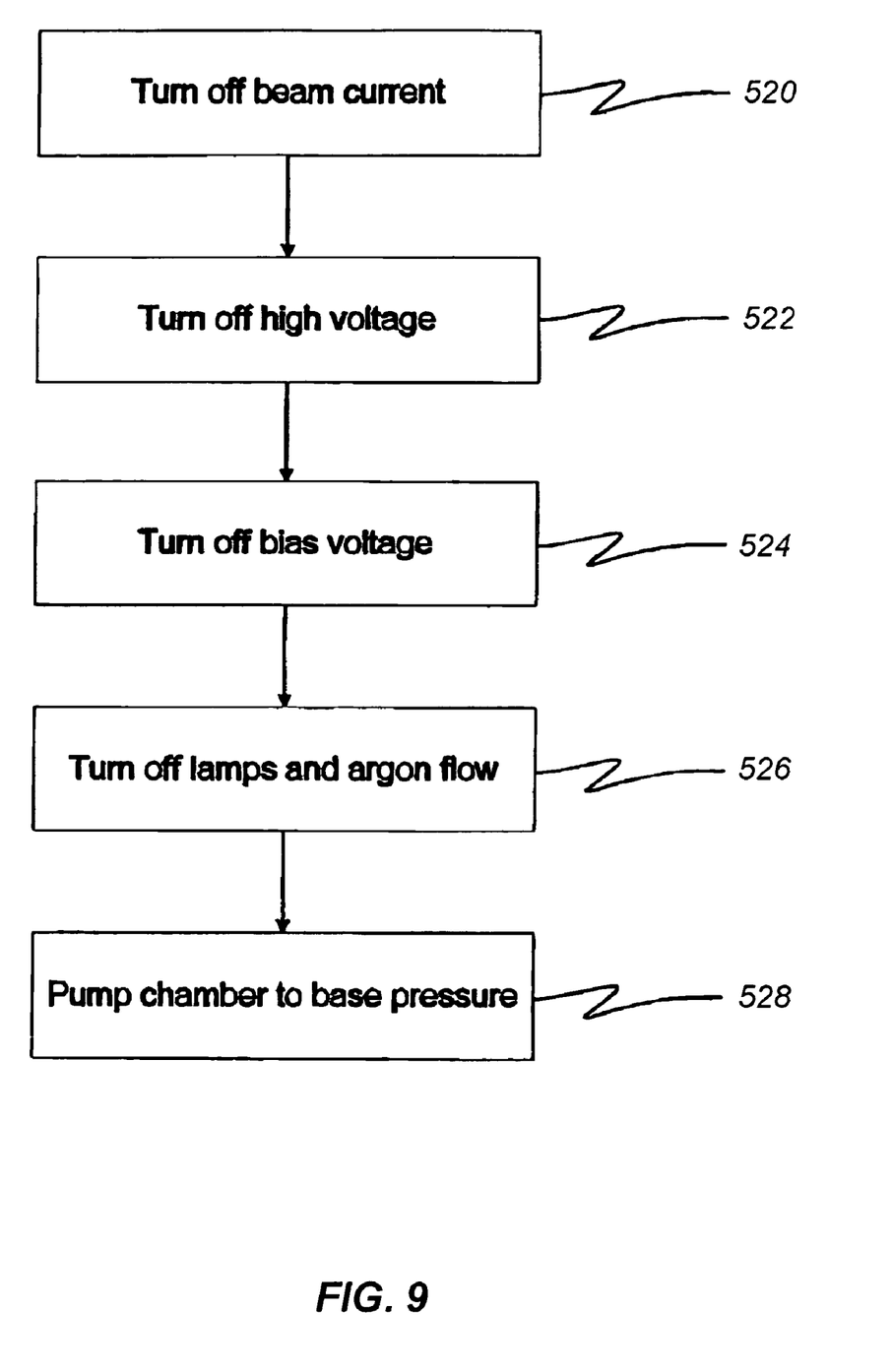
FIG. 9 is a simplified flowchart of a turn-off sequence used in an embodiment according to the present invention.

FIG. 9 is a simplified flowchart of a shut-down sequence used in an embodiment according to the present invention. In step 520, the beam current is turned off.

In one embodiment, the beam current is turned off by modifying the voltage applied to the grid anode. For example, a positive voltage may be applied to the grid, such that the positive voltage exceeds the energy of any of the positive ion species created in the space between the grid 26 and the target workpiece 30 (see FIGS. 1 and 2).

In accordance with an alternative embodiment, the beam current is turned off by decreasing the number of molecules in the ionization region between the target and the cathode. For example, opening the throttle valve to 90° will decrease the number of molecules to a range at which the beam current will be turned off.

In a particular embodiment according to the present invention, the time allotted to step 520 is a predetermined time. For example, in a specific embodiment, the time allotted to step 520 is three seconds. In other embodiments, the time allotted to step 520 is a greater or lesser time.

In step 522, the high voltage applied to the cathode is turned off. In step 524, after a slight delay period necessary to allow the low density plasma resulting from deactivation of the high voltage to dissipate charge from the wafer, the bias voltage applied to the anode is turned off. In embodiments according to the present invention, the times allotted to steps 522 and 524 are predetermined times. For example, in a specific embodiment, the time allotted to step 522 is 10 seconds and the time allotted to step 524 is five seconds. In other embodiments, the times allotted to steps 522 and 524 are greater or lesser times.

In step 526, the process gases are turned off. In a specific embodiment, the process gas is argon, the flow of which is terminated in step 526. Additionally, the heating elements are also turned off in this step. Finally, in step 528, the chamber is pumped to the base pressure.

Figure 10:
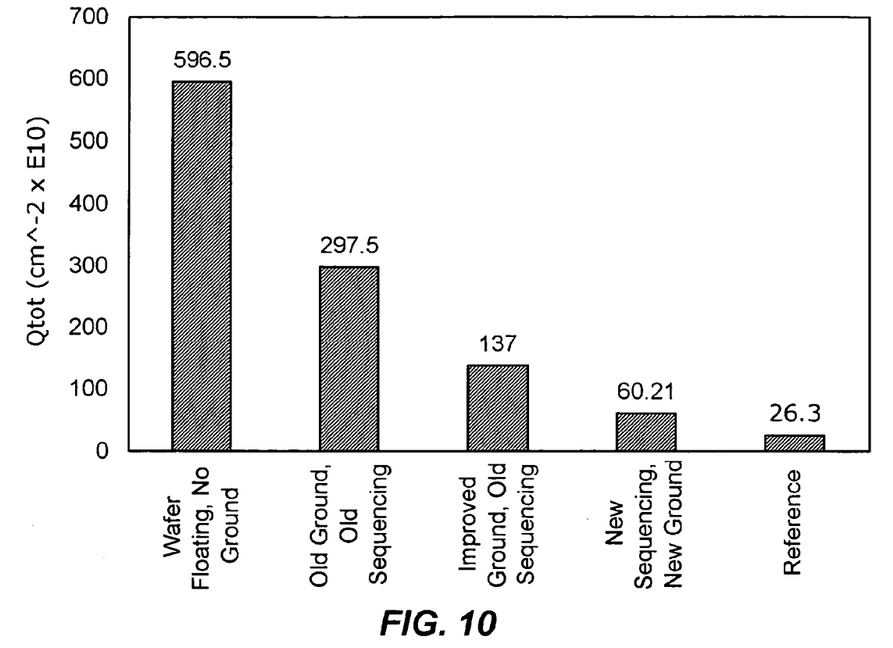
FIG. 10 plots accumulated charge for substrates exposed to e-beam radiation under a number of different conditions.

Experimental results have indicated that improved substrate grounding (as described above in conjunction with FIGS. 7A-D), and alteration of the activation/deactivation sequence (as described above in conjunction with FIGS. 8-9), may serve alone or in combination to beneficially reduce accumulation of charge on a wafer. FIG. 10 plots accumulated charge ($Q_{tot}$), under the five sets of conditions indicated. The "Improved Ground" or "New Ground" refers to the threaded ground pin shown in FIG. 7C. The "Improved Sequencing" or "New Sequencing" refers to a process sequence featuring all charged aspects of both the activated and deactivated sequences of FIGS. 8 and 9. The data shown in FIG. 10 was produced by irradiating a 200 mm wafer at a high power of 4 KeV, with a current of 3 mA, a dosage of 1000 $\mu C/cm^2$, at a temperature of 400° C.

FIG. 10 indicates that use of the improved grounding reduced accumulated charge by over 50%. FIG. 10 also indicates that the improved sequencing recipe reduced charge accumulation by an additional 20% at a dose of 1000 $\mu C/cm^2$. At a dose of 100 $\mu C/cm^2$ (not shown in FIG. 10), accumulated charge may be reduced even further. In some embodiments, the accumulated charge is normalized to provide an accumulated charge density, also referred to as an effective charge, measured in total charge per square centimeter.

C. Plasma Discharge

In the modified sequence of e-beam deactivation steps shown in FIG. 9, a residual low density plasma was exploited to remove accumulated charge on the wafer. However, embodiments in accordance with the present invention are not limited to reducing charge accumulation with such a residual plasma.

In accordance with alternative embodiments of the present invention, following e-beam exposure, a DC plasma may be purposefully struck in the chamber to provide an increased concentration of ions near the semiconductor surface, thereby allowing for a reduction in the build-up of charge.

Table 1 shows the value of a number of chamber parameter settings used during an experiment conducted by the inventors, in which a substrate was irradiated with e-beam radiation at 400° C., at an energy of 4 KeV, a current of 3 mA, and a dose of 1000 $\mu C/cm^2$.

TABLE 1

| Parameter (Units) | E-Beam Treatment | Plasma |
|---|---|---|
| High Voltage (keV) | −4.0 | −0.5 |
| Bias Voltage (V) | −125 | −150 |
| Argon Flow (sccm) | 100 | 100 |
| Throttle Valve Position (°) | 30 | 15 |
| Chamber Pressure (mTorr) | 35 | 60 |
| Process Time (s) | — | 30 |

The second column shows the chamber settings used during an e-beam treatment process and the third column shows the chamber settings used during a subsequent low density plasma treatment process. Referring to Table 1, the last row of the second column is blank because the e-beam treatment process was terminated after a predetermined exposure dose (in this experiment 1,000 μC/cm$^2$) was reached, not after a specific period of time had elapsed.

Figure 11:
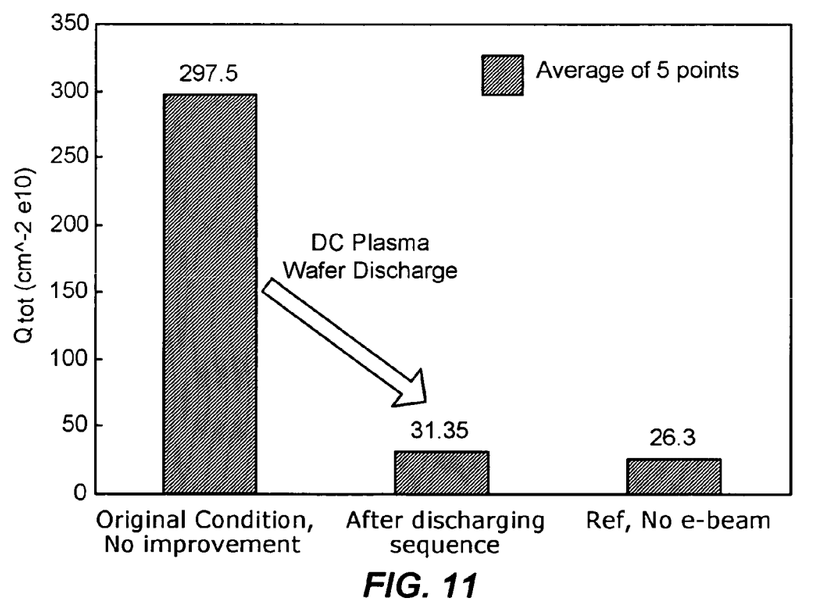
FIG. 11 plots accumulated charge for substrates exposed to a post-e-beam treatment plasma discharge.

Results from the various portions of the experiment are shown in FIG. 11, which plots total charge buildup ($Q_{tot}$) per cm$^2$ for three cases: 1) after e-beam treatment (without low density plasma treatment); 2) after e-beam treatment followed by low density plasma treatment; and 3) a reference/control of no e-beam or low density plasma treatment.

FIG. 11 indicates that the charge buildup in the dielectric was reduced from 297.5×10$^{10}$ eV$^{-1}$cm$^{-2}$ to 31.35×10$^{10}$ eV$^{-1}$cm$^{-2}$ following the plasma treatment. This level of accumulated charge after plasma treatment compares favorably with the reference charge of 26.3×10$^{10}$ eV$^{-1}$cm$^{-2}$ that was measured in the absence of any application of e-beam irradiation. In one embodiment, accumulated charge density is measured in units of total charge per square centimeter. In another embodiment, interface trap density is measured in units of eV$^{-1}$cm$^{-2}$. Both measurements techniques can be employed in measuring reductions in charge density provided by embodiments in accordance with the present invention.

According to the embodiment depicted in Table 1, the high voltage applied to the cathode during the post-irradiation plasma treatment is set at −0.5 keV. In alternative embodiments, the high voltage may be set to a lower value, including zero. Similarly, the bias voltage applied to the anode during the low density plasma treatment is set at −150 V. In alternative embodiments, the bias voltage may range to about −500 V, encompassing such possible bias voltage settings such as −50 V, −100 V, and −125 V.

As will be evident to one of skill in the art, the flow rate of the process gas, (here argon), the throttle valve position, and the chamber pressure are related. Accordingly, an increase in the gas flow rate or a decrease in the throttle valve position will increase the chamber pressure. An increase in chamber pressure will result in an increase in the number of ions available to dissipate charge buildup in the dielectric materials present on semiconductor surface. Thus while the process time in this embodiment is 30 seconds, this specific value is not required by the present invention, and the plasma exposure time will operate as a function of the number of available ions, among other factors.

D. Reduced Anode Voltage

As described in detail above, a bias voltage applied to the anode serves to control electron emission from the cathode. Conventionally, a bias anode voltage of −125 V has been applied to an aluminum anode. However, this magnitude of anode voltage has been observed to result in arcing events between the anode and the substrate, thereby contributing to unwanted accumulation of charge.

Moreover, the −125 V value for the anode voltage was based upon prior applications involving a large area e-beam source operated at room temperature and having a graphite anode. Such graphite anodes, however, are not suitable for higher temperature applications in accordance with the present invention, and have been replaced with anodes comprising aluminum. Another possible example of a material comprising the anode is titanium.

The aluminum material of the anode utilized by a large area electron beam source in accordance with the present invention exhibits a different secondary yield coefficient than the graphite material of the conventional anodes. Specifically, when ions bombard the anode (and cathode), they generate secondary electrons. The number of secondary electrons that are generated depend on the secondary electron yield coefficient. If the coefficient is 1.0, then the generation of secondary electrons is 100%. Graphite exhibits a secondary yield coefficient of about 0.086, while aluminum exhibits a secondary yield coefficient of about 0.125. Given that graphite has a lower secondary electron yield coefficient than Al, when graphite is used as the anode, a higher voltage needs to be used to generate the same number of secondary electrons.

The improved secondary yield coefficient of aluminum relative to graphite allows a reduced bias voltage to be applied to the anode of the large area electron. For example, for a high (cathode) voltage of 4 keV or greater, the bias (anode) voltage may range from about −50 V to about −500 V. At lower cathode voltages, the upper limit of the range of allowable anode voltages would be reduced.

Possible Applications

Embodiments of apparatuses and methods for electron beam exposure in accordance with the present invention may be employed in a variety of applications. One such application is in the curing of deposited low K films to form ultra low K nanoporous films. U.S. Pat. No. 6,541,367, incorporated by reference herein for all purposes, describes one method of forming such a nanoporous film. Another such method is described in U.S. Pat. No. 6,596,627, also incorporated by reference herein for all purposes. E-beam processing is more fully described in U.S. patent application Ser. No. 10/302,375, entitled, "Method For Curing Low Dielectric Constant Film By Electron Beam", filed on Nov. 22, 2002, incorporated by reference herein for all purposes.

Other embodiments of the disclosed invention can be used for shadow mask lithography. An aperture plate or mask 48 is placed between the grid 26 and in contact or close proximity with the target 30, as shown in FIG. 3. Since the electrons moving toward the target 30 are nearly collimated by the accelerating field, as indicated at 50, and have relatively small transverse velocities, a shadow mask, such as the plate 48, placed in close proximity to the target will be accurately replicated by the electron beam 52 that is allowed to pass through the mask or aperture plate. In this way patterned lithography can be performed using the principle of the invention.

Figure 4:
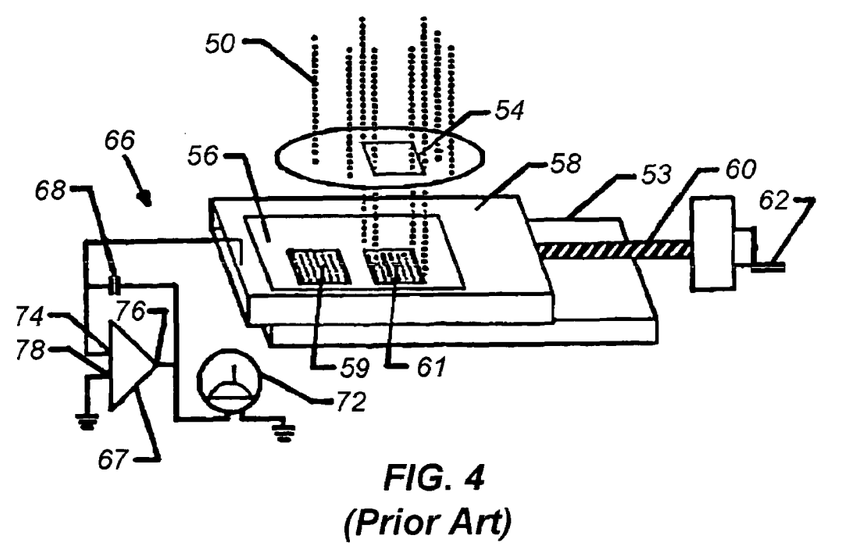
FIG. 4 is a schematic view of another embodiment of the invention, used as an exposure tool for determining resist sensitivity.

In yet another embodiment of the invention, used as a resist sensitivity tool as shown in FIG. 4, a shaped aperture 54 is placed between the grid and target. This aperture can form a small shaped electron beam having a uniform current density. The target material is then scanned or stepped under the beam to generate multiple patterns in an electron sensitive resist coated on the substrate or target. The electron beam passes through the shaped aperture 54 and impinges on a target substrate, indicated at 56 in FIG. 4, which is mounted on a movable slide 58, which is in turn, mounted on base 53. After exposing a square feature 59 of the substrate 56, the slide 58 is moved by means of a leadscrew drive 60 and crank 62. The crank motion is coupled into the vacuum system by a suitable rotary mechanical vacuum feedthrough (not shown). The substrate 56 is moved over enough to expose a new area of resist 61. Multiple exposures are made at different selected exposure doses and accelerating voltages. This technique has proved to be a very useful tool in evaluating the sensitivity of resist. By exposing a series of square patterns across a substrate, with each square having a slightly different level of exposure, resist sensitivity curves can be quickly established. Prior to the present invention, this could only be done with a very expensive electron beam lithography system. In this application, it is important to provide a very precise and uniform exposure in each feature exposed. It has been found by deflecting the beam above the aperture, utilizing magnetic deflection coils 34, that more uniform exposures can be achieved. The deflection coils scan different portions of the cathode emitting area over the pattern forming aperture, thereby averaging any nonuniformities in cathode emission. Since the aperture size is known, the exposure dose is determined with a simple electronic integrator 66, which measures the total integrated current reaching the substrate. The substrate is electrically connected to the integrator, which consists of a capacitor 68, operational amplifier 67, and voltmeter 72. The current collected by the substrate tends to charge the capacitor 68 through a feedback loop. The inverting input 74 of the operational amplifier 70 is a virtual ground referenced to the non-inverting input 78. The voltage at the amplifier output 76 is related to the dose by the expression D=EC/A, where D is the exposure dose in Coulombs per square centimeter, E is the voltage at the output 76, C is the capacitance in Farads of the capacitor 68, and A is the area in square centimeters of the aperture 54. The advantage of this method of dose control is that it measures actual dose in real time. In conventional electron beam lithography systems, the exposure dose is indirectly determined by the time of exposure and independent measurement of beam current before or after the actual exposure.

Another application of this invention is to resist curing. In semiconductor fabrication after pattern lithography has been performed, a resist layer must be hardened or cured prior to etching. Conventional practice utilizes baking of the resist to a high temperature. However, at these elevated temperatures the resist melts slightly and the pattern areas become distorted. Electron beam exposure of the resist provides a nonthermal means of crosslinking and hardening the resist. The substrate stays at room temperature yet the resulting exposed resist is fully crosslinked without pattern flow. With this invention, resist curing can be faster than ultraviolet curing or baking and results in a tougher resist film. In addition the electron beam can cure very thick resists, up to 20 micrometers at 30 KeV, which cannot be cured using ultraviolet curing systems. The ultraviolet radiation is absorbed in surface layers of the resist. Prior to this invention, electron beam curing of resist has not been widespread, due to the cost and time required by conventional electron beam lithography systems. With this new approach, using an inexpensive electron source as described, electron beam curing becomes a favorable alternative to baking or ultraviolet curing.

Another application of the disclosed invention is to provide an easily modulated electron beam source for lithography. In most electron beam lithography systems the electron beam is at high energy and is not easily turned on (unblanked) and off (blanked). To accomplish blanking in prior art systems the beam is deflected off an aperture in the electron optical column. However, there are drawbacks to this approach: the beam at the target plane moves while blanking occurs causing unwanted anomalies in the patterns being written. In addition the beam's continuous bombardment on the blanking aperture causes contamination and charging of the aperture deflecting the beam and causing errors in positioning of patterns being written. In practicing the present invention, it has been found that, at lower vacuum levels than practiced in prior art systems, electron emission has been achieved by biasing the anode aperture or grid 26, and further that a high energy beam >30 KeV can be turned on and off with just a few (1 to 5) volts variation on the grid. This small voltage on the exit aperture or grid anode has virtually no effect on the beam's landing position. This permits this electron source to be utilized in high resolution electron beam lithography and pattern generation as well as other applications requiring a modulated electron beam such as electron beam testing and inspection of integrated circuit devices.

Figure 5:
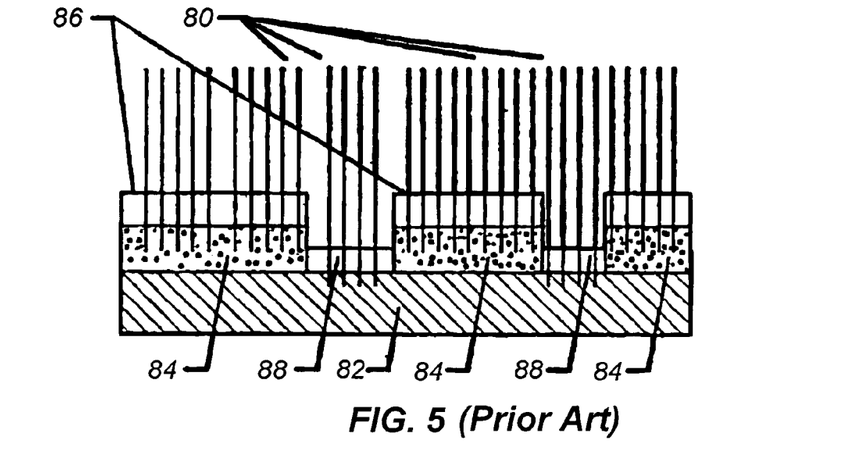
FIG. 5 is a schematic view showing use of the invention in a lift off process.

Another very useful application of the disclosed invention is as an aid in lift off processing as used in semiconductor fabrication. Lift off techniques in depositing patterned metal films have become quite widespread in semiconductor processing. As shown in FIG. 5, a substrate 82 to be patterned is coated with a photoresist 84, and exposed and developed using conventional photolithography. The metal to be deposited on the substrate is evaporated or sputtered on top of the resist film 84, as indicated at 86, and directly to the substrate 82 in developed windows in the resist, as indicated at 88.

At this point in the process, all that remains is to dissolve the resist remaining, i.e. in areas under the metal at 86, which will leave the metal film at areas 88, in the selected patterned areas only. However, this is the most difficult step in lift off processing, because the metal film covers the resist and keeps the solvent from dissolving the underlying resist. One proposed solution to this problem is to employ a high-power laser to disrupt the metal film over the resist. However, a better technique is to employ the new electron source of the present invention. By utilizing a broad area electron beam 80, it is possible to render the underlying resist 84 more soluble by exposing it with the electron beam at an appropriately high energy, such as 30 KeV. In addition to making the underlying resist more soluble, with large exposure doses (200 $\mu C/cm^2$) the metal film 86 tends to blister, allowing a solvent to reach the underlying resist 84 in the subsequent dissolution process step. Although this technique may have been possible using conventional electron beam pattern generation systems, it was not practical because of the large exposure dose required over the entire substrate.

Figure 6:
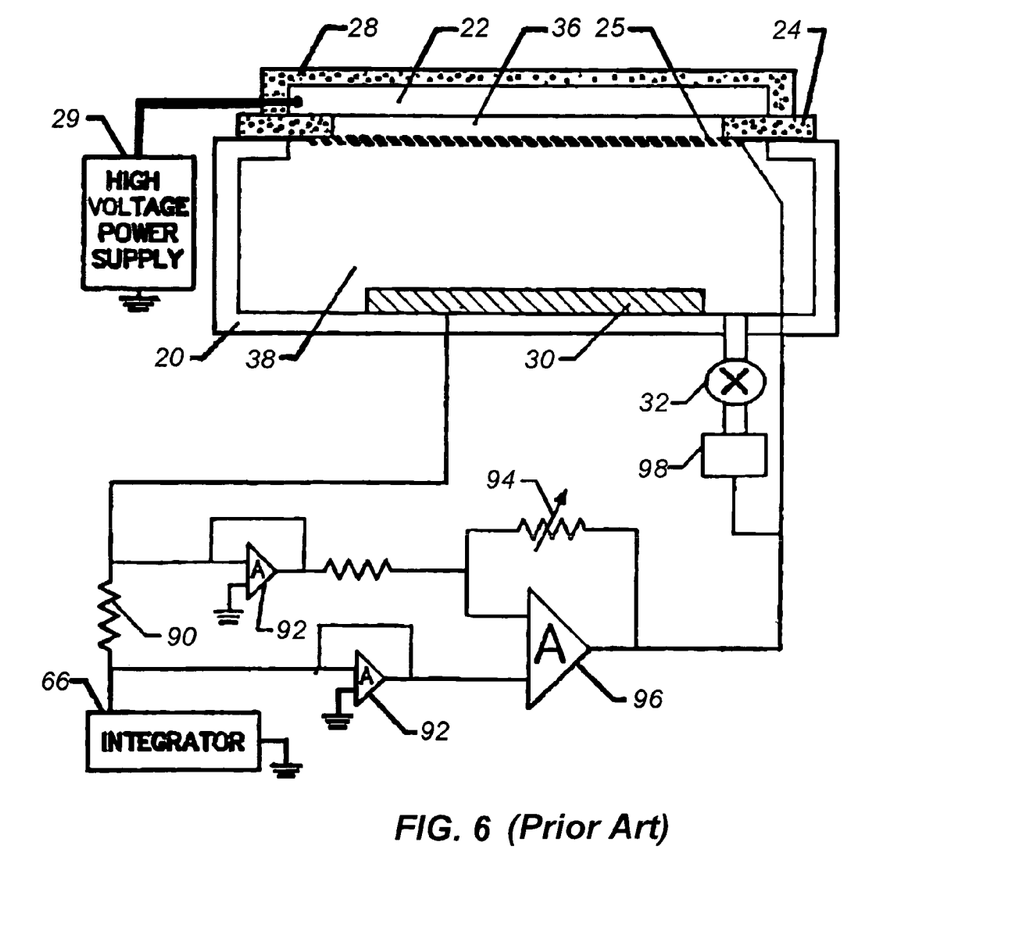
FIG. 6 is a view similar to FIG. 1, and showing the use of feedback to control beam current.

A further embodiment of this invention is shown in FIG. 6. In some applications it may be desirable to provide a constant beam current at different electron beam energies. For example it may be desirable to expose or cure the upper layer of resist on a resist coated substrate, but not the bottom layer. This can be done by utilizing an electron beam energy low enough such that most of the electrons are absorbed in the upper layer of the resist. Subsequent to curing the top layer, it may be desirable to cure the full thickness of the resist layer. This can be done by raising the accelerating voltage of electron beam to penetrate completely through the resist layer to the substrate. It would be desirable in performing these exposures to be able to alter the accelerating voltage without causing a change in the emission current. However, if the accelerating voltage is increased it tends to cause more ionization and therefore an increase in beam current. Similarly if the accelerating voltage is lowered, ionization lessens and the beam current is decreased. A means of maintaining a constant beam current independent of changes in accelerating voltage is shown in FIG. 6. The beam current is sampled via a sense resistor 90, which is placed between the target and the integrator 66. (Alternatively, the beam current could be sampled at the grid as a portion of the beam is intercepted there.) Two unity gain voltage followers 92 buffer the signal obtained across the sense resistor 90 and feed it to an amplifier 96 with adjustable gain through variable resistor 94. The output of this amplifier controls the voltage on the grid anode 26, such that an increase in beam current will cause a decrease in bias voltage on the grid and decrease in emission current from the cathode 26. The gain of the amplifier 96 is adjusted, by means of the variable resistor 94, so that any change in current caused by a change in the accelerating voltage is counteracted by a change in bias voltage to maintain the beam current reaching the target constant. Alternatively, the output of the amplifier 96 can be connected to a voltage controlled variable rate leak valve 98, to counteract changes in emission current by raising or lowering the pressure in the field free region 38 where ionization occurs. Further, a wider range of beam current control could be provided by utilizing feedback signals to both the variable leak valve 98 and the grid 26.

It will be appreciated from the foregoing that the present invention represents a vast improvement over other electron sources. In particular, the electron source of the invention provides a uniform, large-area beam of electrons at an easily controlled current level. Moreover, beam uniformity and beam current control are effective over a wide range of beam accelerating voltages, and under relatively poor vacuum conditions.

It will also be appreciated that, although various embodiments of the invention have been described in detail for purposes of illustration, various modifications may be made without departing from the spirit and scope of the invention. Accordingly, the invention is not to be limited except as by the appended claims.

Merely by way of example, the invention has been applied to reducing charge buildup in dielectric films that are exposed to radiation from large area electron beam sources. The method and structure can be applied to other applications including, but not limited to, the control of charge buildup in other materials, such as semiconductor materials, composite semiconductor/dielectric materials, and the like.

While the above is a complete description of specific embodiments of the present invention, various modifications, variations, and alternatives may be employed. These equivalents and alternatives are included within the scope of the present invention. Therefore, the scope of this invention is not limited to the embodiments described, but is defined by the following claims and their full scope of equivalents.

What is claimed is:

1. A method of irradiating a substrate with an electron beam, the method comprising:
    disposing a substrate within a chamber proximate to a source anode of an electron beam source;
    placing the substrate into electrical contact with ground through a supporting pin provided in threaded engagement with a grounded chamber body; and
    exposing the substrate to radiation from the electron beam.

2. The method of claim 1 wherein:
    exposing the surface of the substrate to electron beam radiation comprises delaying application of a bias voltage to the source anode until a process gas has flowed into the chamber for a predetermined time; and
    the method further comprises delaying regulation of a chamber throttle valve to adjust a current of the electron beam until a high voltage has been applied to a source cathode for a second predetermined time.

3. The method of claim 1 further comprising introducing a plasma into the chamber following exposure of the substrate to the electron beam.

4. The method of claim 3 wherein the plasma is intentionally struck in the chamber.

5. The method of claim 1 further comprising:
    flowing a process gas into the chamber;
    deactivating the high voltage to the source cathode; and
    then deactivating the bias voltage to the source anode, thereby sustaining a plasma in the chamber.

6. The method of claim 1 wherein exposing the substrate to radiation from the electron beam comprises applying a voltage difference of about 3.05 KeV or less between the source anode comprising aluminum and a source cathode comprising aluminum.

7. The method of claim 6 wherein exposing the substrate to radiation from the electron beam comprises applying a voltage difference of about 2.95 KeV or less between the source anode comprising aluminum and the source cathode comprising aluminum.

8. The method of claim 6 wherein a high voltage of about +3 KeV is applied to the source cathode, and a bias voltage of about −50 V is applied to the source anode.

9. The method of claim 6 wherein a high voltage of about −3 KeV is applied to the source cathode, and a bias voltage of about −50 V is applied to the source anode.

10. The method of claim 1 wherein:
    the supporting pin is in electrical contact with a lower surface of the substrate; and
    exposing the substrate to radiation from the electron beam comprises exposing an upper surface of the substrate to radiation.

11. The method of claim 1 wherein the supporting pin is in physical contact with a lower surface of the substrate.

12. The method of claim 1 wherein the supporting pin comprises a fixed pin mounted on an interior surface of the grounded chamber body.

13. An apparatus for treating a substrate with electron beam radiation, the apparatus comprising:
    a processing chamber enclosing a substrate support, wherein the substrate support is grounded;
    an electron beam source comprising an anode proximate to the substrate support and a cathode distal from the substrate support; and
    a ground pin in threaded engagement with the substrate support and configured to be in electrical communication with an underside of a supported substrate, and in electrical communication with ground.

14. The apparatus of claim 13 wherein the ground pin is in physical contact with a chamber ground.

15. The apparatus of claim 13 wherein the ground pin is in physical contact with a chamber ground.

16. The apparatus of claim 13 wherein the ground pin comprises a fixed pin.

17. A method of irradiating a substrate with an electron beam, the method comprising:
    disposing a substrate within a chamber proximate to a source anode of an electron beam source;
    placing the substrate into electrical contact with ground through a supporting pin provided in physical contact with a metal gasket of the chamber; and
    exposing the substrate to radiation from the electron beam.

18. The method of claim 17 wherein the supporting pin comprises a fixed pin.

19. The method of claim 17 wherein the supporting pin is in physical contact with a lower surface of the substrate.

20. The method of claim 17 wherein:
    exposing the surface of the substrate to electron beam radiation comprises delaying application of a bias voltage to the source anode until a process gas has flowed into the chamber for a predetermined time; and the method further comprises delaying regulation of a chamber throttle valve to adjust a current of the electron beam until a high voltage has been applied to a source cathode for a second predetermined time.

21. The method of claim 17 further comprising introducing a plasma into the chamber following exposure of the substrate to the electron beam.

22. The method of claim 21 wherein the plasma is intentionally struck in the chamber.

23. The method of claim 21 wherein the plasma is residual from a delay between deactivation of the high voltage to the source cathode, and deactivation of the bias voltage to the source anode, while processing gas is flowed into the chamber.

24. The method of claim 17 wherein exposing the substrate to radiation from the electron beam comprises applying a voltage difference of about 2.95 KeV or less between the source anode comprising aluminum and a source cathode comprising aluminum.

25. The method of claim 17 wherein exposing the substrate to radiation from the electron beam comprises applying a voltage difference of about 3.05 KeV or less between the source anode comprising aluminum and a source cathode comprising aluminum.

26. The method of claim 25 wherein a high voltage of about +3 KeV is applied to the source cathode, and a bias voltage of about −50 V is applied to the source anode.

27. The method of claim 25 wherein a high voltage of about −3 KeV is applied to the source cathode, and a bias voltage of about −50 V is applied to the source anode.

* * * * *